(12) United States Patent
Shinosawa et al.

(10) Patent No.: US 6,689,498 B2
(45) Date of Patent: Feb. 10, 2004

(54) ALUMINUM NITRIDE SUBSTRATE AND THIN FILM SUBSTRATE THEREWITH, AND MANUFACTURING METHOD THEREOF

(75) Inventors: Katsuhiro Shinosawa, Yokohama (JP); Takao Shirai, Yokohama (JP); Noritaka Nakayama, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 50 days.

(21) Appl. No.: 10/000,953

(22) Filed: Dec. 4, 2001

(65) Prior Publication Data

US 2002/0102441 A1 Aug. 1, 2002

(30) Foreign Application Priority Data

Dec. 4, 2000 (JP) .......................... 2000-368607
Jul. 6, 2001 (JP) .......................... 2001-206904
Nov. 15, 2001 (JP) .......................... 2001-350153

(51) Int. Cl.$^7$ ................................. B32B 9/00
(52) U.S. Cl. ................ 428/698; 428/701; 428/332; 428/309; 428/209; 427/299; 427/309
(58) Field of Search .............. 428/698, 701, 428/372, 309, 209; 427/299–309

(56) References Cited

U.S. PATENT DOCUMENTS 5,085,923 A * 2/1992 Yamakawa et al. ......... 428/209
5,213,877 A * 5/1993 Yoshida et al. ............. 428/209

FOREIGN PATENT DOCUMENTS

| JP | 0 487 728 A1 | * | 6/1992 | ............. C04B/35/58 |
| JP | 5-238830 | * | 9/1993 | |
| JP | 0 615 952 A2 | * | 9/1994 | ............. C01B/21/06 |
| JP | 11-31869 | * | 2/1999 | |
| JP | 2000-281427 | * | 10/2000 | |

* cited by examiner

Primary Examiner—Deborah Jones
Assistant Examiner—Vivek Koppikar
(74) Attorney, Agent, or Firm—Foley & Lardner

(57) ABSTRACT

An aluminum nitride substrate includes an aluminum nitride sintered body containing a rare earth oxide as a sintering additive component. In the aluminum nitride substrate, a surface thereof is machined so that arithmetic average roughness Ra is 0.5 μm or less; an aggregate size of the sintering additive component present on the machined surface is 20 μm or less; and a total aggregate area in a unit area of the machined surface is 5% or less. A metal thin film is deposited on such machined surface with good intimate contact properties, and furthermore deposition accuracy or the like is improved.

12 Claims, 3 Drawing Sheets

ALUMINUM NITRIDE SUBSTRATE AND THIN FILM SUBSTRATE THEREWITH, AND MANUFACTURING METHOD THEREOF

BACKGROUND OF THE INVENTION

1. Field of the Invention

The present invention relates to an aluminum nitride substrate for use as a substrate for depositing a thin film circuit or the like, and a thin film substrate therewith and a manufacturing method thereof.

2. Description of the Related Art

In a microwave integrated circuit, since a semiconductor chip may be directly connected to an impedance matching circuit in a microwave band, an influence of parasitic reactance due to a package or a lead wire may be remarkably diminished. As a result, a small and accurate microwave frequency band active circuit may be realized. Recently, by making use of such advantages, the microwave integrated circuits have began rapidly expanding uses as hybrid ICs for optical communication, hybrid ICs for mobile communication, hybrid ICs for laser diodes, hybrid ICs for automobiles and so on.

In the microwave integrated circuit, since higher accuracy and higher reliability are demanded, thin film deposition technique, such as sputtering, vacuum vapor deposition, and CVD, in particular, PVD (Physical Vapor Deposition), is generally used for circuit formation. In the circuit (thin film circuit), to which the thin film deposition, such as the PVD or the like, is applied, patterning accuracy is superior by one digit or more to that of a thick film circuit; film material is higher in purity; and, furthermore, accuracy, noise characteristics, temperature characteristics and stability of a film element are excellent.

In a thin film hybrid IC in which a thin film circuit is applied, since the circuit may be highly integrated, heat generation amount accompanying circuit operation is in an increasing tendency. Furthermore, since the development of a semiconductor chip of higher power is in progress, the heat generation amount from the semiconductor chip is increasing year by year. Accordingly, the substrate for the microwave ICs is important to be excellent in heat dissipation characteristics, and aluminum nitride substrates, which are excellent in thermal conductivity, are in heavy usage. Thus, for the microwave IC substrates, thin film substrates, in which a thin film circuit is deposited on the aluminum nitride substrate that is excellent in thermal conductivity, are in heavy usage. The thin film substrates are also used for substrates for sub-mounting the laser diodes.

Furthermore, for the substrate for microwave ICs, in addition to excellent heat dissipation characteristics, surface properties capable of depositing a thin film circuit with accuracy are demanded. That is, when the thin film circuit is deposited by means of the sputtering or the like, the surface properties of a thin film surface (circuit surface) are important; when there is an unevenness on the surface, the circuit is deposited with deteriorated accuracy. Accordingly, as disclosed in, for instance, Japanese Patent Laid-Open Application No. 11-31869 JP-A, in case an aluminum nitride sintered body or the like is used as a thin film substrate, mirror finish is generally applied on the surface thereof. In the aforementioned document, the surface roughness Ra of an insulating substrate, such as the aluminum nitride substrate or the like, is set at 0.1 $\mu$m or less.

In particular, in the aluminum nitride sintered body, when the heat dissipation properties are improved, there is a tendency in that a sintering additive, which forms a liquid phase that may deteriorate the thermal conductivity, is added less. In case the sintering additive is added less, when a sintering temperature is not raised high enough, sintering characteristics deteriorate. However, when the sintering temperature is raised, the sintering additive component (grain boundary phase component) precipitates on a surface of a sintered body, and at the same time, grain growth of aluminum nitride crystal grains tends to occur. The sintering additive component present on the substrate surface lowers a joining strength of the thin film. Furthermore, when there are excessively grown aluminum nitride crystal grains on the substrate surface, since flatness on the substrate surface is deteriorated, it becomes difficult to uniformly deposit a thin film. Accordingly, when a thin film is deposited on the surface of the aluminum nitride sintered body (substrate), the thin film surface is generally mirror-finished. Furthermore, an acid wash is effectively performed after the mirror finish, thereby removing contamination on the substrate surface.

In the existing aluminum nitride sintered body, during the mirror polish or acid wash, the grain boundary phase component present on the surface of the sintered body is likely to fall off or be dissolved. Accordingly, there is a problem in that the thin film is difficult to deposit with high accuracy. As disclosed in the aforementioned Japanese Patent Laid-Open Application No. 11-31869 JP-A, simple mirror polish of the surface of the existing aluminum nitride sintered body is likely to cause the fall off of the grain boundary phase component, which precipitates on the surface thereof, and the aluminum nitride crystal grain. Furthermore, the dissolution or the like of the grain boundary phase component is also likely to be caused at the acid wash. These may cause a relatively large pit. When a thin film is deposited on the surface of the substrate having such a pit, a space may be caused between the thin film and the substrate. The space between the thin film and the aluminum nitride substrate may cause swelling due to heat applied in the later course of manufacture and during the use of the circuit, resulting in lowering the circuit accuracy or in peeling the thin film.

As to the surface properties of the aluminum nitride substrate, for instance, Japanese Patent Laid-Open Application No. 2000-281427 JP-A discloses a substrate in which skewness of a component-mounting surface or a circuit surface is set at 0 or less. In this document, in order to strengthen the joining strength with a metal plate, such as a copper plate, the skewness of the substrate surface is controlled based on the polishing conditions or the like. However, simple control of the polishing conditions of the aluminum nitride sintered body may not necessarily sufficiently satisfy the characteristics demanded for the thin film surface.

Furthermore, Japanese Patent Laid-Open Application No. 5-238830 JP-A discloses an aluminum nitride sintered body, in which, in order to improve the thermal conductivity and the mechanical strength of the aluminum nitride sintered body, the maximum diameter of the grain boundary phase in an internal crystal texture is set at 1 $\mu$m or less, and furthermore the maximum diameter of pore is set at 1 $\mu$m or less. Reduction of the grain boundary phase and the pore inside of the sintered body may contribute in an improvement of the thermal conductivity. However, as mentioned above, since, in the thin film substrate, the surface state may cause problems, simple control of an amount of the grain boundary phase inside the sintered body may not sufficiently satisfy the characteristics demanded for the thin film surface. In particular, in the aluminum nitride sintered body, in which high thermal conductivity is intended, since the grain boundary phase tends to precipitate on the sintered body surface, simple control of the amount of the grain boundary phase inside of the sintered body may adversely affect on the surface characteristics.

BRIEF SUMMARY OF THE INVENTION

Accordingly, an object of the present invention is to provide an aluminum nitride substrate that, in addition to making use of high heat dissipation characteristics of the aluminum nitride substrate, allows improving intimate contact properties with a metal thin film, which is used for depositing various kinds of circuits, and accuracy in thin film deposition. Another object of the present invention is to provide a thin film substrate, in which, by use of such aluminum nitride substrate, reliability or operation characteristics are improved, and a manufacturing method thereof.

The aluminum nitride substrate of the present invention, one that contains a rare earth oxide as a sintering additive component, includes a surface that is machined so that arithmetic average roughness Ra may be 0.5 μm or less, and an aggregate size of the sintering additive component, which is present on the machined surface, is controlled to 20 μm or less, and a total aggregate area in a unit area of the machined surface is controlled to be 5% or less.

In the aluminum nitride substrate of the present invention, the aggregate size of the sintering additive component, which is present on a substrate surface after the machining (machined surface), and the total aggregate area are controlled in predetermined ranges. When the aluminum nitride sintered body is used for the thin film substrate, mirror finish of the surface (thin film surface) thereof is necessary and a further acid wash is effective.

Accordingly, by reducing the size and the total aggregate area of the sintering additive component, which precipitates on the surface of the aluminum nitride sintered body, the pit (cave) due to fall off or dissolution of the aggregate of the sintering additive component in the course of mirror finish or acid wash may be suppressed from occurring. In particular, the pit that is generated due to the dissolution of the aggregate of the sintering additive component during the acid wash may be largely suppressed from occurring. Thereby, when the metal thin film is deposited on the surface of the aluminum nitride substrate by means of PVD method, such as sputtering or vapor deposition, the intimate contact properties of the metal thin film and the deposition accuracy thereof may be largely increased.

The thin film substrate of the present invention includes the aforementioned aluminum nitride substrate of the present invention, and the metal thin film deposited on the machined surface of the aluminum nitride substrate. The thin film substrate of the present invention may be suitably applied to substrates for microwave integrated circuits and sub-mount substrates on which a laser diode is mounted.

BRIEF DESCRIPTION OF THE DRAWINGS

The invention is described with reference to the drawings, which are presented for the purpose of illustration only and do not limit the scope of the invention.

DETAILED DESCRIPTION OF THE INVENTION

In the following, modes for implementing the present invention will be explained.

Figure 1:
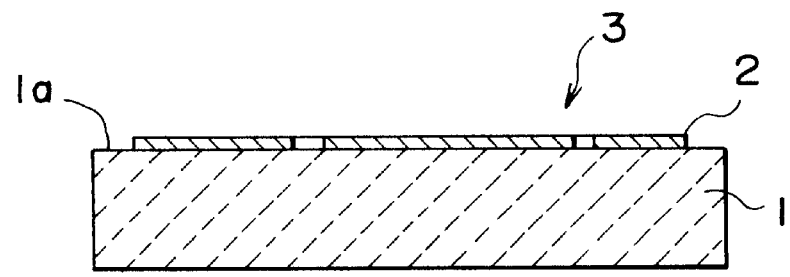
FIG. 1 is a sectional view showing a rough configuration of one embodiment of a thin film substrate that uses an aluminum nitride substrate of the present invention.

FIG. 1 is a sectional view showing a rough configuration of one embodiment of a thin film substrate that uses an aluminum nitride substrate of the present invention. In this figure, reference numeral 1 denotes a substrate, made of an aluminum nitride (AlN) sintered body. The AlN substrate 1 as a thin film substrate is preferable to have a thickness of 1.5 mm or less. Machining, such as grinding or the like, is applied on a surface 1a of the AlN substrate 1, and this machined surface 1a is a thin film surface.

A metal thin film 2 is deposited on the aforementioned machined surface 1a, and therefrom a thin film substrate 3 is configured. The surface roughness of the machined surface 1a is set at 0.5 μm or less in terms of arithmetic average roughness Ra, which is provided by JIS B0601-1994. The machined surface 1a of which arithmetic average roughness Ra exceeds 0.5 μm may not satisfy characteristics demanded for the metal thin film 2 surface.

An aluminum nitride sintered body that constitutes the AlN substrate 1 is substantially constituted of AlN crystal grains and a grain boundary phase present between the AlN crystal grains. The AlN sintered body is preferable to have heat dissipation characteristics in that thermal conductivity at room temperature is 160 W/m K or more. In case the thermal conductivity of the AlN sintered body at room temperature is less than 160 W/m K, when the thin film substrate 3 is applied to, for instance, the microwave integrated circuit or the like, sufficient heat dissipation characteristics may not be secured. As a result, advantages due to the use of the AlN substrate 1 may be damaged.

The AlN sintered body is obtained, for instance, by adding the sintering additive to AlN powder, after further adding a binder and so on thereto, followed by mixing and molding into a predetermined substrate shape, and further followed by sintering the molded body. For the sintering additive, various kinds of metal compounds may be used. However, in view of allowing obtaining the AlN sintered body due to low temperature sintering and of suppressing segregation and aggregation (in particular, segregation and aggregation on the surface 1a) of the grain boundary phase, substantially made of the sintering additive component, at least a rare earth oxide is used.

As the rare earth oxide, for instance, yttrium oxide ($Y_2O_3$), erbium oxide ($Er_2O_3$), ytterbium oxide ($Yb_2O_3$) and soon may be cited, and, among them, yttrium oxide is particularly preferably used. The rare earth oxide is preferably compounded in the range of from 1 to 10% by mass with respect to the AlN powder. When the rare earth oxide is compounded exceeding 10% by mass, the grain boundary phase, which is substantially made of the sintering additive component, tends to aggregate; an amount of the aggregate of the sintering additive component in the machined surface 1a of the AlN substrate 1 tends to increase. On the other hand, when the rare earth oxide is compounded less than 1% by mass, sintering characteristics of the AlN sintered body or the like may be deteriorated to result in an increase of the pore or a decrease of the thermal conductivity. The rare earth oxide is furthermore preferably compounded in the range of from 2 to 6% by mass.

For the sintering additive, in addition to the rare earth oxides, oxides of alkaline-earth metal elements, such as Ca, Ba, Sr or the like, Si compounds, such as $SiO_2$, $Si_3N_4$ or the like, and boron compounds, such as $B_2O_3$, $B_4C$, $TiB_2$, $LaB_6$ or the like may be used together. The rare earth oxides and the alkaline-earth oxides may be compounded as, carbonates, oxalates, nitrates, fluorides or the like, all of which are converted into oxides during the sintering. Furthermore, blackening materials, such as $TiO_2$, $HfO_2$, $ZrO_2$ or the like may be used together. When these compounds are used together with the rare earth oxide, a total amount of the sintering additive is preferable to be controlled in the range of from 2 to 12% by mass in terms of oxide.

Figure 2:
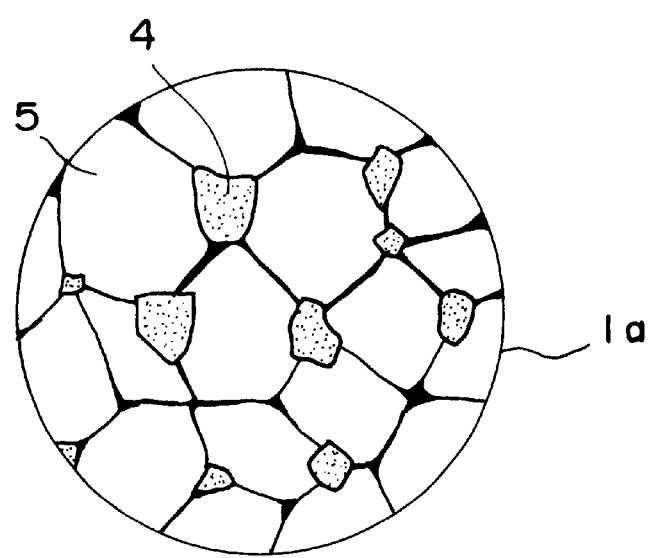
FIG. 2 is a schematic diagram showing, in enlargement, a microstructure of a machined surface of the aluminum nitride substrate shown in FIG. 1.

In the aforementioned AlN substrate 1, as shown in an enlarged schematic diagram of FIG. 2, the aggregate 4 size of the sintering additive component, which is present on the surface 1a after machining so that Ra may be 0.5 μm or less, is provided to be 20 μm or less. Thereby, a large pit (cave) is inhibited from occurring on the substrate surface 1a after the mirror finish or the acid wash. In FIG. 2, reference numeral 5 denotes AlN crystal grain.

That is, the sintering additive, such as the rare earth oxide or the like, reacts with, for instance, AlN or impurity alumina (impurity oxygen) in AlN powder, and is present in the grain boundary phase as a rare earth element-Al—O (—N) system compound and so on. The sintering additive component including the rare earth oxide precipitates on the surface of the AlN sintered body in the form of the compounds, which constitute the grain boundary phase, or as compounds more rich in the rare earth element than those, thereby forms the aggregate 4. When the aggregate 4 size of such sintering additive component exceeds 20 μm, the aggregate 4 is likely to fall off or dissolve in the course of the mirror finish or the acid wash. In particular, since the compound, which constitutes the aforementioned grain boundary phase, is easily dissolved by an acid, the dissolution of the aggregate 4 in the course of the acid wash after the mirror finish may cause a large pit (cave). The fall off or the dissolution of the aggregate 4 of the sintering additive component may easily cause detachment of the AlN crystal grain 5.

In the present invention, the size of the aggregate 4 of the sintering additive, which is present on the machined surface 1a of the AlN substrate 1, is controlled to be 20 μm or less. The present size of the aggregate 4 of the sintering additive component means the maximum diameter. Thus, by suppressing the sintering additive on the surface of the AlN sintered body from aggregating, and by controlling the size of the aggregate 4 present on the machined surface 1a of the AlN substrate 1 to be 20 μm or less, the pit (cave) due to the fall off or dissolution of the aggregate 4 in the course of the mirror finish or the acid wash may be suppressed from occurring. The size of the aggregate 4 of the sintering additive component present on the machined surface 1a of the AlN substrate 1 is more preferable to be 10 μm or less.

Furthermore, in the AlN substrate 1, a total area of the aggregate 4 of the sintering additive component in a unit area (100×100 μm, for instance) of the machined surface 1a is provided to be 5% or less. In addition to making the size of the aggregate 4 smaller, by making a ratio of the total area of the aggregate 4 in a unit area of the machined surface 1a smaller, a generation amount of the pit due to the fall off or the dissolution of the aggregate 4 may be diminished. The ratio of the total area of the aggregate 4 in a unit area of the machined surface 1a of the AlN substrate 1 is preferable to be 3% or less. The methods for diminishing the size or the total area of the aggregate 4 of the sintering additive component will be detailed below.

The aggregate 4 of the sintering additive component present on the machined surface 1a of the AlN substrate 1 may be confirmed by observing the machined surface 1a by means of a scanning electron microscope (SEM), or by investigating an elemental distribution on the machined surface 1a by means of an electron probe microanalyzer (EPMA). The aggregate 4 of the sintering additive component, being conspicuously different in its morphology from that of the grain boundary phase present between the AlN crystal grains 5, may be confirmed by means of SEM or EPMA. For instance, in case $Y_2O_3$ is used as the sintering additive, when the aggregate 4 of an $Y_2O_3$ containing compound (for instance, Y—Al—O (—N) system compound) is checked by means of EPMA, Y is detected with a concentration ratio denser than that of the grain boundary phase. In a SEM image also, the aggregate 4 of the $Y_2O_3$ containing compound appears with a concentration different from that of the grain boundary phase present between the AlN crystal grains 5.

The size of the aggregate 4 of the sintering additive component denotes the maximum diameter of the aggregate 4 of the sintering additive component shown in the EPMA image or the SEM image, which is taken of an arbitrary position on the machined surface 1a of the AlN substrate 1. Furthermore, an area ratio of the aggregate 4 denotes a ratio of the total area of the aggregate 4 in a unit area. The total area of the aggregate 4 is obtained from the total area of the aggregate 4 of the sintering additive component present in a unit area (100×100 μm) of the aforementioned EPMA image or the SEM image, and by calculating a ratio in a unit area. The area ratio is obtained by measuring three or more arbitrary positions and by averaging these values.

On the basis of the configuration (size and area ratio) of the aggregate 4 of the sintering additive component in the aforementioned machined surface 1a, the AlN substrate 1 may be suppressed from dissolving the aggregate 4 during the acid wash. Specifically, when the AlN substrate 1 is immersed in an acid solution diluted to a concentration of 20% and kept at a temperature of 40° C. for 60 min, the AlN substrate satisfies the characteristics in that a diminution ratio by mass after the acid immersion is 0.1% or less. As the acid solution for use in the acid wash of the AlN substrate 1, a sulfuric acid ($H_2SO_4$) solution, a hydrochloric acid (HCl) solution, a nitric acid solution ($HNO_3$) and so on may be cited.

Thus, by suppressing the pit, due to the fall off or dissolution of the aggregate 4 of the sintering additive component, from occurring, the flatness of the final surface 1a of the AlN substrate 1, that is, the substrate surface as the thin film surface, may be improved. The flatness here means a state where there are no particularly large caves. Accordingly, when the metal thin film 2 is deposited by means of the sputtering or the like, a thickness of the metal thin film 2 may be suppressed from becoming uneven, or the space may be suppressed from occurring between the AlN substrate 1 and the metal thin film 2. According to the metal thin film 2 formed on such substrate surface 1a, when, for instance, a high precision circuit is intended, or during the later process or circuit operation, the swelling due to heat may be suppressed from occurring.

Furthermore, by suppressing the mass decrease due to the dissolution or the like of the aggregate 4 of the sintering additive component, deterioration of the mechanical strength after the acid wash may be suppressed. Specifically, when three point bending strength is measured after the AlN substrate 1 is immersed in an acid solution (sulfuric acid, hydrochloric acid, nitric acid, and so on) diluted to 20% concentration and kept at a temperature of 40° C. for 60 min, a ratio of the three point bending strength after the immersion in the acid solution to that before the immersion in the acid solution may be maintained at 70% or more. This largely contributes in improving reliability in mounting the thin film substrate 3 on various kinds of apparatuses. As a specific example of the acid wash, the acid wash in which the AlN substrate is immersed in the acid solution diluted to 20% by concentration and kept at a temperature of 40° C. for 60 min is cited. However, the acid wash of the AlN substrate is not restricted to these conditions, and, the conditions for the acid wash may be altered according to actual use conditions.

The surface 1a of the AlN substrate 1 that becomes the thin film surface is machined, as mentioned above, so that the surface roughness may be at least 0.5 $\mu$m or less in terms of arithmetic average roughness Ra. In order to further improve the characteristics of the substrate surface 1a as the thin film surface, the surface 1a of the AlN substrate 1 is preferably mirror-finished so that the Ra may be 0.05 $\mu$m or less. According to the mirror-finished surface of which surface roughness Ra is made 0.05 $\mu$m or less, the accuracy in forming the metal thin film 2 or intimate contact properties thereof may be furthermore increased.

The substrate surface, of which surface roughness Ra is made 0.05 $\mu$m or less, is further preferable for a value of skewness Rsk (a warp value), provided by JIS B0601-1994, to be 0 or more and 1 or less. That is, when the surface roughness of the mirror finished surface of the AlN substrate 1 has the Ra of 0.05 $\mu$m or less and Rsk of 0 or more and 1 or less, the intimate contact properties and the film deposition accuracy of the metal thin film 2, which is deposited by means of sputtering or vapor deposition method, may be largely improved.

The skewness Rsk here is a value expressing the warp of the surface and is obtained in the following ways. That is, a roughness curve, called an amplitude distribution curve, is divided into equi-distances between the highest peak and the lowest valley, and a ratio of the number of data present in a domain between two parallels to the number of the total data is plotted on an abscissa and a value in a height direction in the roughness curve of each data is plotted on an ordinate. The skewness Rsk denotes the deviation in up and down direction of this plotting.

Such skewness being less than 0 (Rsk<0), that is, being a minus value, shows that there are many pits in a downward direction; there occur many fallen off aggregates, substantially made of the sintering additive component, or pores formed on the substrate surface due to detachment of the AlN crystal grains. The pores formed on the substrate surface include not only pits due to detachment occurring during the grinding, but also fallout of the AlN crystal grains formed on the substrate surface. Accordingly, when the metal thin film 2 is deposited, the film thickness tends to be uneven; and the space tends to occur between the AlN substrate 1 and the metal thin film 2. These may cause accuracy deterioration or peel in the circuit formed with the metal thin film 2.

on the other hand, when the skewness Rsk of the mirror finished surface exceeds 1 (Rsk>1), as a whole, there are too many upward peaks; in such cases also, the circuit deposition accuracy due to the metal thin film 2 deteriorates. In other words, by reducing the surface roughness Ra of the mirror finished surface of the AlN substrate 1 to 0.05 $\mu$m or less, and by controlling the skewness Rsk to 0 or more and 1 or less, the intimate contact properties and the film deposition accuracy of the metal thin film 2, used as the thin film circuit or the like, may be largely improved.

In case the surface 1a of the AlN substrate 1 is mirror finished so that the Ra may be 0.05 $\mu$m or less, it is of course that the polishing or the like has to be performed under the stricter conditions in comparison with the case where the Ra is reduced to 0.5 $\mu$m or less. Specifically, the substrate surface may be polished by use of free-floating abrasive. Even in such cases, by diminishing the size and the total are of the aggregate of the sintering additive component, which precipitates on the surface of the AlN sintered body, the mirror finished surface of which Ra is 0.05 $\mu$m or less may be obtained with reproducibility.

The size and the total area of the aggregate of the sintering additive component affect also on the value of skewness Rsk. Reduction of the size and the total area of the aggregate of the sintering additive component, which precipitates on the surface of the AlN sintered body, is effective in controlling so that the skewness Rsk of the mirror finished surface may be 0 or more and 1 or less. Furthermore, when attaining such skewness Rsk, relatively large pit may be desirably suppressed from occurring. Accordingly, the number of the aggregate of the sintering additive component of which size is 10 $\mu$m or more and the pore having the similar size (in total) is preferable to be three pieces or less (includes 0) in a unit area of 100×100 $\mu$m of the mirror finished surface. Furthermore, as to the aggregate of the sintering additive component and the pore, of which size are less than 10 $\mu$m, an area ratio in a unit area of 100×100 $\mu$m of the mirror finished surface is preferable to be 3% or less. In other words, even when the AlN substrate (sintered body) is machined so that the surface roughness Ra may be 0.5 $\mu$m or less, furthermore 0.05 $\mu$m or less, the pore formed on the machined surface may be small and slight. Thus, even when the AlN substrate of the present invention is ground, crystal grain detachment or the like is difficult to occur.

When the aforementioned coarser aggregate of the sintering additive component and pore (10 $\mu$m or more in size) exist exceeding three pieces in a unit area of 100×100 $\mu$m, the skewness Rsk of the mirror finished surface of the AlN substrate 1 tends to be a minus value (Rsk<0). Similarly, when the ratio (area ratio) of the aggregate of the sintering additive component and pore, of which size are less than 10 $\mu$m, exceeds 3%, the skewness Rsk decreases. Furthermore, in view of making the skewness Rsk of the mirror finished surface of the AlN substrate 1 in the range of 0 or more and 1 or less, it is important, in addition to optimizing the machining conditions during the surface finishing, also to control the crystal grain size and grain size distribution of the AlN sintered body as a base material. These points will be detailed below.

The size of the aggregate 4 of the sintering additive component on the machined surface 1a of the aforementioned AlN substrate 1, and the total area of the aggregate 4 may be diminished by, for instance, making the crystal grain of the AlN sintered body smaller and by making the grain size distribution thereof sharper. Specifically, the average AlN crystal grain diameter is preferably made in the range of from 3 to 5 $\mu$m, and a standard deviation of the grain size distribution is preferably made 2 $\mu$m or less. Thus, by making the AlN crystal grain size smaller, and by making the grain size distribution sharper, the precipitation and aggregation of the sintering additive component (grain boundary phase component) may be suppressed. The AlN crystal grain size denotes a diameter (the maximum diameter of the AlN crystal grain) of the smallest circle encompassing the crystal grain.

That is, when the average AlN crystal grain size exceeds 5 μm, since the space (triple point, for instance) between individual AlN crystal grains becomes larger, a precipitating amount of the sintering additive component (grain boundary phase component) increases; the aggregate 4 of the sintering additive component becomes larger; and the total area of the aggregate 4 tends to increase. The situations are similar in the standard deviation of the grain size distribution, that is, when the value thereof exceeds 2 μm, an amount of the sintering additive component precipitating on the surface of the sintered body increases. On the other hand, when the average grain size of the AlN crystal grains is less than 3 μm, thermal conductivity of the AlN sintered body remarkably decreases; thermal conductivity of, for instance, 160 W/m K at room temperature may not be satisfied. This causes characteristics deterioration of the thin film substrate 3.

The average grain size and grain size distribution of the AlN crystal grains also affect on the skewness Rsk when mirror finish is applied on the surface of the AlN substrate 1. That is, when the average grain size of the AlN crystal grains exceeds 5 μm, the AlN crystal grain tends to detach during grinding/polishing, and an influence of the pit due to crystal grain detachment on the skewness Rsk increases. As a result, the skewness Rsk of the mirror finished surface of the AlN substrate 1 tends to be a minus value (Rsk<0). The situations are similar in the standard deviation of the grain size distribution; when the value thereof exceeds 2 μm, an influence of the detached AlN crystal grain becomes larger.

The AlN sintered body, which has the aforementioned small crystal grain size and sharp grain size distribution, may be obtained with good reproducibility by applying, for instance, the following manufacturing method. The size and total area of the aggregate 4 of the sintering additive component are not only affected by the average grain size and the grain size distribution of the AlN crystal grains, but also largely affected by the individual process conditions during manufacturing the AlN sintered body. From this point of view also, the AlN sintered body to be used as the base material of the AlN substrate 1 is preferably manufactured by applying the following manufacturing method.

First, AlN raw material powder, of which average particle size is 1 μm or less and impurity oxygen concentration is 1% by mass or less, is prepared. When the average particle size of the AlN powder exceeds 1 μm, AlN crystal grain being obtained tends to be coarser. Similarly, when the impurity oxygen concentration exceeds 1% by mass, the AlN crystal grain may unnecessarily grow larger, and the thermal conductivity of the AlN sintered body deteriorates. A predetermined amount of sintering additive powder is added to such AlN powder, followed by thorough mixing. At this time, in view of suppressing aggregation of the sintering additive component (grain boundary phase component), it is important to apply an addition method that may suppress the aggregation of the sintering additive powder.

That is, when the sintering additive powder is in aggregation in a stage of raw material powder, the grain boundary phase tends to segregate, as a result thereof, the size and total area of the aggregate of the sintering additive component on the surface of the AlN sintered body tend to increase. Therefore, it is preferable to previously disperse the sintering additive powder in an organic solvent, thereby forming slurry, and followed by adding AlN powder into the slurry in which the sintering additive is dispersed in the organic solvent. A dispersion time (stirring time) of the sintering additive powder in the organic solvent is preferable to be 10 min or more. The dispersion time is more preferable to be 1 hr or more and 3 hr or less. The dispersion process may be performed exceeding 3 hr, but a further effect may not be obtained by the longer dispersion time, resulting in only prolonging the manufacturing time. Furthermore, the sintering additive powder and the AlN powder dispersed in the organic solvent are mixed thoroughly by means of a ball mill or the like.

By applying the addition method of the sintering additive powder as mentioned above, the aggregate size of the sintering additive component, and the total aggregate area may be diminished. Furthermore, the sintering additive powder is preferably used in a high purity and fine powder state. For instance, rare earth oxide powder, such as $Y_2O_3$ powder or the like, of 99% or more in purity and 1.5 μm or less in a primary particle size (D(50)) may be preferably used.

Next, a binder component and an organic solvent are added to the mixture of the AlN powder and the sintering additive powder, followed by further mixing, and, thereafter, a molded body (green sheet) is prepared by applying an ordinary sheet formation method, such as doctor blade method or the like. Such AlN molded body is degreased followed by sintering. In view of controlling the crystal grain size of the AlN sintered body and the morphology of the sintering additive component, the degreasing process is preferable to be sufficiently performed. The degreasing process is preferably performed in a non-oxidizing atmosphere, such as nitrogen or argon, at a temperature in the range of from 600 to 800° C.

Figure 3A:
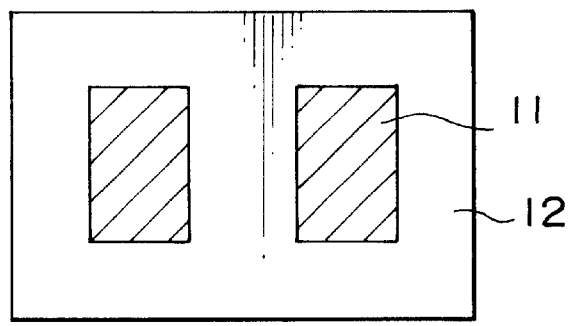
FIG. 3A and FIG. 3B are diagrams showing examples of arrangement of molded bodies in a sintering process of the aluminum nitride substrate of the present invention.
Figure 3B:
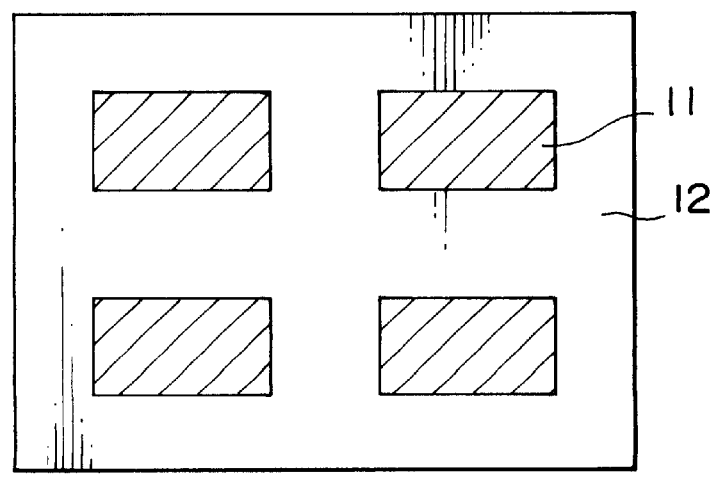

The AlN molded body after the degrease is disposed in a sintering vessel, made of, for instance, AlN, BN or the like. The sintering vessel is preferable to be one capable of air-tightly sealing by means of a lid. At this time, a filling amount of the AlN molded body in the sintering vessel is preferable to be in the range of from 50 to 70% by volume. Furthermore, the AlN molded bodies are preferably arranged symmetrically on a supporting plate equidistance apart. In FIG. 3A and FIG. 3B, examples of symmetrical arrangement of the AlN molded bodies are shown. In these drawings, reference numeral 11 denotes the AlN molded body, and reference numeral 12 denotes a supporting plate disposed on a bottom surface of the sintering vessel or inside the sintering vessel. FIG. 3A shows an example where the AlN molded bodies 11 are symmetrically arranged from side to side (or back and forth). FIG. 3B shows an example where the AlN molded bodies 11 are symmetrically arranged from side to side and back and forth.

Figure 4:
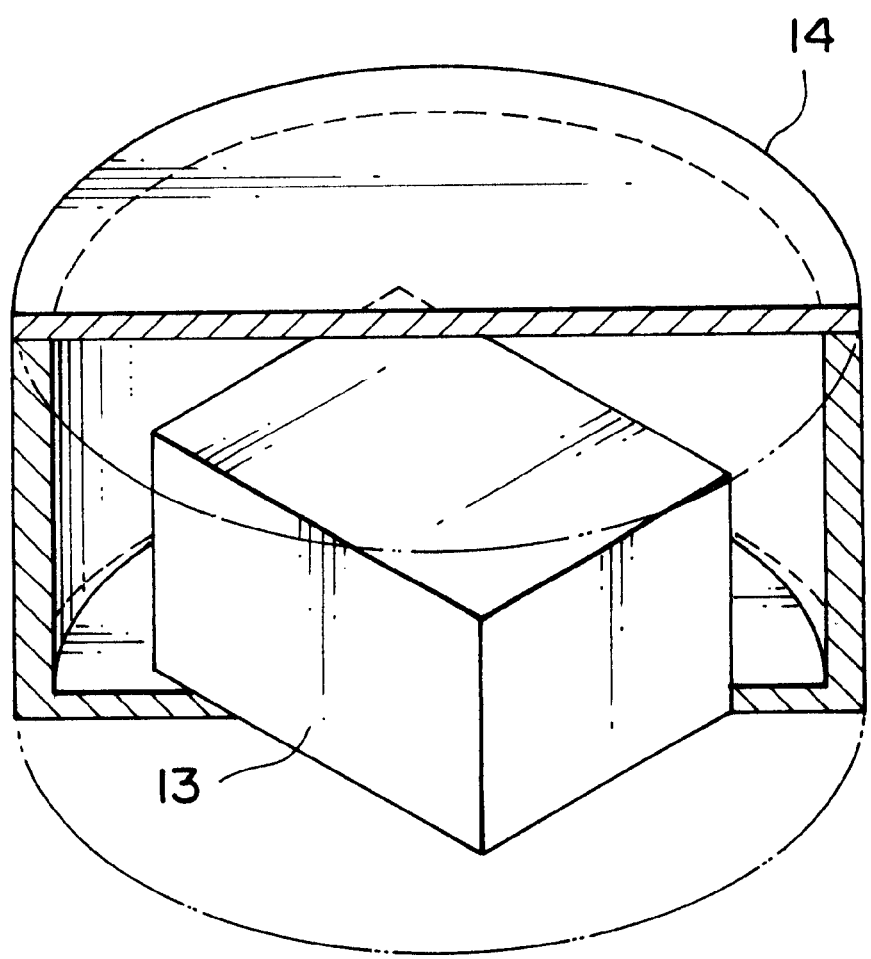
FIG. 4 is a perspective view showing, by partially cutting away, an example of configuration of a dual vessel applied in the sintering process of the aluminum nitride substrate of the present invention.

The sintering vessel in which such AlN molded bodies are filled is disposed in a sintering furnace. At this time, a filling amount of the sintering vessels in the sintering furnace is preferable to be in the range of from 40 to 70% by volume. The sintering vessels in a carbon vessel-accommodating member (cylindrical member) may be disposed in the sintering furnace. In case such dual-vessel is used, it is preferable for a filling amount of the sintering vessels in the carbon vessel-accommodating member to be from 40 to 70% by volume. FIG. 4 shows an example of configuration of the dual-vessel. In FIG. 4, reference numeral 13 denotes the sintering vessel, and reference numeral 14 denotes the vessel-accommodating member. The vessel-accommodating member 14 in which the sintering vessels 13 are accommodated may be stacked, or a plurality of the sintering vessels 13 may be stacked in the vessel-accommodating member 14.

The AlN molded bodies disposed in the sintering furnace in the aforementioned state are sintered in an inert atmosphere, such as a nitrogen atmosphere, at a temperature in the range of from 1650 to 1900° C., for from 1 to 10 hr. The sintering is performed under atmospheric pressure or pressurized atmosphere. The AlN sintered bodies having the aforementioned characteristics may be obtained due to such sintering process. At this time, for the atmospheric gas during the sintering, a nitrogen gas of 99% or more purity may be preferably used. Furthermore, the pressure inside the sintering furnace is preferable to be in the range of from $2 \times 10^5$ to $10 \times 10^5$ Pa, furthermore it is preferable to be adjusted in the range of $\pm 1 \times 10^5$ Pa with respect to a set value, further preferable to be in the range of $\pm 0.3 \times 10^5$ Pa.

By manufacturing the AlN sintered body applying the aforementioned manufacturing conditions, the AlN sintered body, of which average AlN crystal grain size is in the range of from 3 to 5 $\mu$m and standard deviation of the grain size distribution is 2 $\mu$m or less, may be obtained with good reproducibility. Furthermore, based on such average grain size and the grain size distribution of the AlN crystal grains, and the individual manufacturing conditions, the size of the aggregate 4 of the sintering additive component, which is present on the machining surface (Ra$\leq$0.5 $\mu$m) 1$a$ of the AlN substrate 1, may be made 20 $\mu$m or less, and the ratio of the total area of the aggregate in a unit area of the machining surface 1$a$ may be made 5% or less. Simple miniaturization of the crystal grain size may remarkably decrease the thermal conductivity of the AlN sintered body. However, by reducing, for instance, a carbon content remaining after the degreasing, the average AlN crystal grain size may be made smaller and the thermal conductivity of 160 W/m K may be satisfied.

The AlN substrate (substrate for thin film) 1 of the present embodiment may be obtained by grinding the surface (at least the thin film surface) 1$a$ of the AlN sintered body, which is prepared according to the aforementioned manufacturing process, so that the arithmetic average roughness Ra may be 0.5 $\mu$m or less, and furthermore followed by acid wash with an acid solution of sulfuric acid, hydrochloric acid, nitric acid, or the like diluted to, for instance, substantially 20%. The acid wash is preferably performed by immersing the entire AlN sintered body in the acid solution.

In case the surface of the AlN substrate 1 is mirror finished so that the arithmetic average roughness Ra may be 0.05 $\mu$m or less, in view of controlling the skewness Rsk in the range of 0 or more and 1 or less, it is important to optimize the surface machining conditions. Specifically, when the surface of the AlN sintered body is semi-finished with diamond abrasive of, for instance, from 325 to 400 mesh, the surface is machined so that the skewness Rsk thereof may be −1 or more (Rsk $\geq$ −1).

By controlling the surface roughness of the machined surface when the AlN sintered body is semi-finished with the diamond abrasive, the surface roughness after the mirror finish may be made a desired value. That is, when the skewness Rsk of the surface after the semi-finish due to the diamond abrasive is smaller than −1 (Rsk<−1), whatever the mirror finishing conditions after that may are controlled, the surface roughness of the mirror finished surface may not satisfy the desired value. Then, the mirror finish is applied to the surface after the semi-finish so that the Ra may be 0.05 $\mu$m or less. Thereby, the final skewness Rsk of the mirror finished surface may be made in the range of 0 or more and 1 or less.

Furthermore, even after the AlN substrate 1 is ground, since the pore due to the crystal grain detachment is difficult to occur, the substrate thickness may be easily adjusted due to grinding. Accordingly, thickness accuracy of the substrate may be heightened when the thickness of the AlN substrate 1 is adjusted to 1.5 mm or less, furthermore to 0.8 mm or less. The thickness of the AlN substrate 1 may be further adjusted in the range of from 0.1 to 0.4 mm with higher accuracy.

The metal thin film 2 is deposited on the machined surface (thin film surface) 1$a$ of the AlN substrate 1, thereby the thin film substrate 3 is configured. The metal thin film 2 is deposited by means of PVD method, such as, for instance, sputtering, vacuum vapor deposition, molecular beam epitaxy (MBE), ion plating, laser deposition, ion beam deposition and so on. Furthermore, according to circumstances, CVD (Chemical vapor Deposition) method, such as thermal CVD, plasma CVD, optical CVD and so on, may be applied. The metal thin film 2 is not restricted to one that has a circuit structure and may be a solid film. Though the metal thin film 2 may be either one of a single metal film and a laminate film of a plurality of metal films, a total thickness of the film is set at 3 $\mu$m or less.

As mentioned above, by depositing the metal thin film 2 on the machined surface 1$a$ of the AlN substrate 1, in which the size of the aggregate 4 of the sintering additive component and the total aggregate area are reduced, the intimate contact properties thereof and the deposition accuracy of the metal thin film 2 may be largely increased. In particular, the uneven thickness of the metal thin film 2 and the space between the AlN substrate 1 and the metal thin film 2, which are caused due to the pit on the substrate surface, may be suppressed from occurring. Accordingly, accuracy and reliability of the circuit due to the metal thin film 2 may be largely increased. When the thin film surface of the AlN substrate 1 has a predetermined configuration, the AlN substrate 1 may exhibit a desired effect. Accordingly, the substrate surface, on which the thin film is not deposited, need not be configured as mentioned above.

The thin film substrate 3 having such metal thin film (circuit) 2 may be suitably used as a substrate for microwave integrated circuits, such as, for instance, hybrid ICs for optical communication, hybrid ICs for mobile communication, hybrid ICs for laser diodes, and hybrid ICs for automobiles. Furthermore, the thin film substrate 3 having the metal thin film 2 may be effective as the sub-mount substrate thereon the laser diode, such as VLDs (Visible Laser Diode) or the like, is mounted. In particular, since the thickness of the AlN substrate 1 of the present invention may be adjusted between 0.1 and 1.5 mm, it may be applied in various fields such as the substrates for the microwave integrated circuits or sub-mount substrates.

Next, specific embodiments of the present invention and evaluation results thereof will be explained.

Embodiment 1

First, $Y_2O_3$ powder, of which purity is 99% and average particle size is 1.0 $\mu$m, is prepared as the sintering additive. The $Y_2O_3$ powder is poured into an organic solvent (ethanol), followed by mixing. The mixing is performed by use of a ball mill. The mixing time (preliminary mixing time) of the $Y_2O_3$ powder is set at 10 min. Meanwhile, appropriate amounts of the binder the and solvent are added to AlN powder, of which average particle size is 1.0 m and impurity oxygen content is 0.8% by mass, followed by mixing, thereby slurry is prepared. The aforementioned $Y_2O_3$ dispersed body is added to AlN slurry so that a compounding ratio of $Y_2O_3$ may be 5% by mass. This is further mixed for 24 hr by means of the ball mill. Conditions of the individual raw materials are as shown in Table 1.

Next, the aforementioned slurry of raw materials is coated in plate by means of doctor blade method and dried, followed by molding, further followed by degreasing the AlN molded body at a temperature in the range of from 600 to 800° C. The AlN molded body after degreasing is sintered in the following ways. That is, a plurality of the AlN molded bodies after degreasing is arranged in a sealed type high purity AlN (99.9% by mass or more in purity) sintering vessel. A filling amount of the AlN molded bodies in the sintering vessel is set at 50% by volume. Such sintering vessels in a cylindrical carbon member are disposed in the sintering furnace. The filling amount of the sintering vessels in the dual vessel is set at 40% by volume. The sintering is performed under the conditions of (1750 to 1900° C.)×(1 to 8 hr). A sintering atmosphere is a nitrogen gas atmosphere of 99% or more pure, and a pressure inside the furnace is set in the range of from $3 \times 10^5$ to $7 \times 10^5$ Pa. Furthermore, the pressure inside the furnace is controlled in the range of $\pm 0.3 \times 10^5$ Pa with respect to the set pressure value. The sintering conditions are as shown in Table 2.

The average grain size and grain size distribution of thus obtained AlN sintered bodies are investigated. For the AlN crystal grain size, the crystal grain sizes in a unit area of 50×50 µm are measured at arbitrary three points on a fractured surface of the AlN sintered body; the average grain size and the grain size distribution are obtained based on these average values. Among the unit areas of which crystal grain sizes are measured, at least one is desirable to be a position containing the AlN crystal grains adjacent to the machining surface. Furthermore, thermal conductivity of the AlN sintered body is measured. These measurements are shown in Table 3.

Next, the semi-finish and mirror finish (Ra≦0.5 µm) due to diamond abrasive are applied on the aforementioned AlN sintered bodies, thereby AlN substrates (thickness: 0.635 mm) are prepared. The size and area ratio (in total) of the aggregate of the sintering additive component present on the machined surface of the AlN substrate are measured. The shape of the aggregate of the sintering additive component is observed of arbitrary three points on the mirror finished surface by means of SEM (EPMA is used as needs arise); the size and the area ratio (average values) of the aggregate in a unit area (100×100 µm) are obtained. Furthermore, the AlN substrate is immersed in a sulfuric acid solution diluted to 20% (40° C.) for 60 min. The mass diminution ratio after the acid solution immersion and the diminution ratio of three point bending strength are evaluated. These measurements are shown in Table 4.

Embodiments 2 to 9, Comparative Examples 1 to 7

With the exception of changing the conditions of AlN powder and sintering additive powder and sintering conditions to the conditions respectively shown in Table 1 and Table 2, similarly as Embodiment 1, individual AlN sintered bodies are prepared. The average grain size and standard deviation of the grain size distribution, and thermal conductivity are measured of each of the AlN sintered bodies in the similar ways as embodiment1. These results are shown in Table 3.

Furthermore, the individual AlN sintered bodies are processed similarly as Embodiment 1, thereby individual AlN substrates are prepared. Thereafter, the size and the area ratio of the aggregate of the sintering additive component present on the machined surface are measured of each of the AlN substrates. Still furthermore, similarly as Embodiment 1, the mass diminution ratio after the acid solution immersion and the diminution ratio of three point bending strength of the AlN substrate are investigated. The acid solutions used for acid wash are as shown in Table 4. These measurements are shown in Table 4.

TABLE 1

| | Raw Material | | | |
|---|---|---|---|---|
| | Average Particle Size of AlN Powder (µm) | Impurity Oxygen Content in AlN Powder (% by mass) | Kind of Sintering Additive (Added Amount, by mass %) | Preliminary Mixing Time of Sintering Additive (min) |
| E1 | 1.0 | 0.8 | $Y_2O_3$(5%) | 10 |
| E2 | 0.8 | 1.0 | $Y_2O_3$(5%) | 30 |
| E3 | 0.8 | 0.8 | $Y_2O_3$(5%) | 60 |
| E4 | 0.8 | 0.6 | $Y_2O_3$(3%) | 60 |
| E5 | 0.8 | 1.0 | $Er_2O_3$(8%) | 60 |
| E6 | 0.8 | 1.0 | $Yb_2O_3$(8%) | 60 |
| E7 | 0.6 | 0.6 | $Y_2O_3$(5%) | 60 |
| E8 | 0.8 | 0.8 | $Y_2O_3$(5%) | 150 |
| E9 | 0.8 | 0.8 | $Y_2O_3$(5%) | 300 |
| CE1 | 1.0 | 1.0 | $Y_2O_3$(5%) | not applied |
| CE2 | 1.0 | 1.0 | $Y_2O_3$(5%) | not applied |
| CE3 | 1.0 | 1.0 | $Y_2O_3$(5%) | not applied |
| CE4 | 1.0 | 1.0 | $Y_2O_3$(5%) | not applied |
| CE5 | 1.0 | 1.0 | $Y_2O_3$(5%) | 10 |
| CE6 | 2.5 | 1.0 | $Y_2O_3$(5%) | 10 |
| CE7 | 1.0 | 2.2 | $Y_2O_3$(5%) | 10 |

E = Embodiment, CE = Comparative Example

TABLE 2

| | Sintering Conditions | | | | |
|---|---|---|---|---|---|
| | Kind of Sintering Vessel | Filling Amount of Molded Body in Sintering Vessel (%) | Filling Amount of Sintering Vessel in Dual Vessel (%) | Purity of Nitrogen Gas (%) | Pressure Control of Atmosphere |
| E1 | CT | 50 | 40 | ≧99 | controlled |
| E2 | CT | 60 | 50 | ≧99 | controlled |
| E3 | CT | 65 | 60 | ≧99 | controlled |
| E4 | CT | 70 | 70 | ≧99 | controlled |
| E5 | CT | 60 | 60 | ≧99 | controlled |
| E6 | CT | 60 | 60 | ≧99 | controlled |
| E7 | CT | 60 | 60 | ≧99 | controlled |
| E8 | CT | 60 | 50 | ≧99 | controlled |
| E9 | CT | 60 | 50 | ≧99 | controlled |
| CE1 | CT | 90 | 20 | ≧99 | not controlled |
| CE2 | OT | 20 | 80 | ≧99 | controlled |
| CE3 | CT | 20 | 20 | ≧99 | controlled |
| CE4 | CT | 90 | 90 | ≧99 | not controlled |
| CE5 | not used | | 50 | ≧99 | controlled |
| CE6 | CT | 50 | 50 | ≧99 | controlled |
| CE7 | CT | 50 | 50 | ≧99 | controlled |

E = Embodiment, CE = Comparative Example, CT = Closed Type, OT = Open Type

TABLE 3

AlN Sintered Body

| | Average Grain Size of AlN Crystal Grain ($\mu$m) | Standard Deviation of Grain Size Distribution ($\mu$m) | Thermal Conductivity (W/m k) |
|---|---|---|---|
| E1 | 5.0 | 2.0 | 207 |
| E2 | 4.5 | 1.8 | 210 |
| E3 | 3.8 | 1.5 | 209 |
| E4 | 3.6 | 1.3 | 208 |
| E5 | 4.0 | 1.8 | 200 |
| E6 | 4.1 | 1.8 | 197 |
| E7 | 3.5 | 1.5 | 203 |
| E8 | 3.0 | 1.3 | 193 |
| E9 | 3.0 | 1.3 | 195 |
| CE1 | 7.4 | 3.0 | 190 |
| CE2 | 7.0 | 3.5 | 185 |
| CE3 | 6.0 | 2.5 | 188 |
| CE4 | 5.0 | 3.4 | 192 |
| CE5 | 8.3 | 3.6 | 180 |
| CE6 | 10.0 | 5.1 | 195 |
| CE7 | 6.0 | 3.2 | 130 |

E = Embodiment, CE = Comparative Example

TABLE 4

| | AlN Substrate | | | Characteristics after Acid Wash | |
|---|---|---|---|---|---|
| | Maximum Aggregate Size ($\mu$m) | Aggregate Area Ratio in a Unit Area (%) | Acid Solution (Concentration) | Mass Diminution Ratio after Acid Wash (%) | Diminution Ratio of Three Point Bending Strength after Acid Wash (%) |
| E1 | 14 | 5 | Sulfuric Acid (20%) | 0.08 | 17 |
| E2 | 14 | 4 | Sulfuric Acid (20%) | 0.08 | 15 |
| E3 | 12 | 3 | Sulfuric Acid (20%) | 0.05 | 13 |
| E4 | 10 | 3 | Sulfuric Acid (20%) | 0.03 | 11 |
| E5 | 12 | 3 | Sulfuric Acid (20%) | 0.08 | 15 |
| E6 | 10 | 4 | Sulfuric Acid (20%) | 0.05 | 13 |
| E7 | 8 | 3 | Sulfuric Acid (20%) | 0.03 | 13 |
| E8 | 5 | 2 | Sulfuric Acid (20%) | 0.02 | 9 |
| E9 | 6 | 3 | Sulfuric Acid (20%) | 0.02 | 11 |
| CE1 | 35 | 7 | Sulfuric Acid (20%) | 0.51 | 50 |
| CE2 | 28 | 6 | Sulfuric Acid (20%) | 0.50 | 47 |
| CE3 | 25 | 7 | Sulfuric Acid (20%) | 0.48 | 46 |
| CE4 | 22 | 6 | Sulfuric Acid (20%) | 0.45 | 44 |
| CE5 | 30 | 10 | Sulfuric Acid (20%) | 0.50 | 50 |
| CE6 | 40 | 14 | Sulfuric Acid (20%) | 0.58 | 55 |
| CE7 | 24 | 5 | Sulfuric Acid (20%) | 0.44 | 42 |

E = Embodiment, CE = Comparative Example

It is obvious from Table 3 that in all of the AlN sintered bodies of Embodiments 1 through 9, the AlN crystal grain sizes are small and the standard deviations of the grain size distribution are small. On the basis of the state of the AlN crystal grain sizes and the manufacturing conditions of the AlN sintered bodies, in the AlN substrates of individual Embodiments, as shown in Table 4, the aggregate sizes of the sintering additive component in the machined surfaces are 20 $\mu$m or less, and the total aggregate areas in a unit area are 50% or less. Based on these configurations, the mass diminution ratios after acid solution immersion and the diminution ratios of the three point bending strength are small.

Embodiments 10 to 14, Comparative Examples 8 and 9

With each of the AlN substrates due to the aforementioned Embodiment 1, Embodiment 2, Embodiment 4, Embodiment 7, Embodiment 8, Comparative Example 1, and Comparative Example 2, a metal thin film having a structure of Ti film (thickness: 100 nm)/Pt film (thickness: 200 nm)/Au film (thickness: 500 nm) is deposited on the machined surface thereof by means of vacuum deposition method (vacuum: $10^{-5}$ Pa). Thus, the individual thin film substrates are manufactured.

Of each of thus obtained thin film substrates, the peel strength of the metal thin film (multi-layered film of a substantial thickness of 800 nm) is measured. The peel strength is measured by means of scotch tape peel test. Specifically, Scotch Tape (manufactured by Sumitomo 3M Co), which is larger in its area than that of the metal thin film, is attached, and the attached tape is peeled at one stroke. An area ratio of remaining thin film (remaining area ratio=(remaining area after the peel test/an area before the peel test)×100%) is measured. In addition, the similarly manufactured thin films are heated on a hot plate under the conditions of 450° C.×10 min and 600° C.×10 min, respectively. Swelling of each the metal thin films after the heat treatment is checked. These results are shown in Table 5.

TABLE 5

| AlN Substrate | | Peel Test Result (Remaining Area Ratio, %) | Swelling after Heat Treatment under 450° C. × 10 min | Swelling after Heat Treatment under 600° C. × 10 min |
|---|---|---|---|---|
| E10 | same as E1 | 75 | not observed | not observed |
| E11 | same as E2 | 80 | not observed | not observed |
| E12 | same as E4 | 82 | not observed | not observed |
| E13 | same as E7 | 85 | not observed | not observed |
| E14 | same as E8 | 90 | not observed | not observed |
| CE8 | same as CE1 | 30 | observed | observed |
| CE9 | same as CE2 | 35 | observed | observed |

E = Embodiment, CE = Comparative Example

It is obvious from Table 5 that the individual thin film substrates of Embodiments 10 through 14 are excellent in intimate contact properties of the thin film circuit, and furthermore, since there is no swelling observed when heated, these substrates are suitable for the substrates for microwave integrated circuits and sub-mount substrates for laser diodes.

Embodiments 15 to 19, Comparative Examples 10 to 12

Similarly as the aforementioned Embodiment 3, a plurality of AlN sintered bodies is prepared. However, the sintering temperatures are varied between 1730 and 1840° C., and the sintering times between 3 and 6 hr. The average grain size and the grain size distribution, and thermal conductivity of each of the obtained AlN sintered bodies are as shown in Table 6. These are measured in the similar ways as Embodiment 1.

Next, to each of the aforementioned individual AlN sintered bodies, under the conditions shown in Table 6, semi-finish (the first finishing process) and the mirror finish (the second finishing process) by use of the diamond abrasive are applied, respectively, and, thereby, a plurality of AlN substrates, of which surface state of the mirror finish are different from each other, is prepared. Of each of thus obtained AlN substrates, the number and area ratio of the aggregates of the sintering additive component and pores present on the mirror finished surface, furthermore the skewness Rsk of the mirror finished surface, and the maximum diameter of the pores (detachment pit due to the detached AlN crystal grain and detached aggregate) are measured. These results are shown in Table 7.

The skewness Rsk is measured by means of a surface roughness measurement instrument: Form Talysurf S4C (product of Rank Taylor Bobson Co. Ltd). For the shape of the aggregate of the sintering additive and the pore, arbitrary three points on each of the mirror-finished surfaces are observed by means of SEM and EPMA. From these observations, the number of the aggregate and pore, of which sizes are 10 μm or more, in a unit area (100×100 μm), and ratio (area ratio) of the aggregate and pore, of which sizes are less than 10 μm, in a unit area (100×100 μm), are obtained as the average values, respectively. The maximum sizes of the pores are measured of arbitrary three points on the mirror-finished surface. The largest one thereof is taken as the maximum pore size.

TABLE 6

AlN Substrate

| | Average Grain Size (μm) | Standard Deviation of Grain Size Distribution (μm) | Thermal Conductivity of AlN Sintered Body (W/m K) | Surface Finish Conditions | | | | |
|---|---|---|---|---|---|---|---|---|
| | | | | Abrasive No. at First Finish | RsK after First Finish | Abrasive No. at Second Finish | Ra after Second Finish (μm) | |
| E15 | 3 | 1 | 170 | #325 | −0.5 | #600 | 0.05≧ | |
| E16 | 3 | 1.5 | 170 | #325 | 0 | #600 | 0.05≧ | |
| E17 | 4 | 1.3 | 175 | #325 | +0.5 | #600 | 0.05≧ | |
| E18 | 4 | 1.6 | 175 | #400 | −1.0 | #600 | 0.05≧ | |
| E19 | 5 | 1.9 | 180 | #400 | −0.5 | #700 | 0.05≧ | |
| CE10 | 8 | 3.0 | 185 | #325 | −1.5 | #600 | 0.05≧ | |
| CE11 | 2 | 1.3 | 140 | #325 | −0.5 | #600 | 0.05≧ | |
| CE12 | 3 | 1.5 | 170 | #325 | −0.5 | not used | ≧0.05 | |

E = Embodiment, CE = Comparative Example

TABLE 7

| | Aggregate of Sintering Additive and Pore | | | Size of Pit |
|---|---|---|---|---|
| | Number of ≧10 μm in a Unit Area (pieces) | Area Ratio of 10 μm ≧ in a Unit Area (pieces) | Rsk of Mirror Finished Surface (μm) | due to Detached AlN Crystal Grain (Maximum) (μm) |
| E15 | 2 | 3 | 0 | 15 |
| E16 | 1 | 2 | +0.5 | 10 |
| E17 | 1 | 1.7 | +0.2 | 5 |
| E18 | 0 | 0.8 | +1.0 | 5 |
| E19 | 1 | 1.2 | +0.5 | 7 |
| CE10 | 7 | 8 | −1.0 | 50 |
| CE11 | 2 | 5 | +0.5 | 4 |
| CE12 | 5 | 7 | −0.5 | 30 |

E = Embodiment, CE = Comparative Example

As shown in Tables 6 and 7, all of the AlN substrates according to Embodiments 15 through 19 have thermal conductivity values of 160 W/m K or more and skewness Rsk values of the mirror-finished surface of 0 or more and 1 or less. On the basis such surface state, the maximum pit sizes due to AlN crystal grain detachment are small. This shows that the detachment of the AlN crystal grain is suppressed.

On the other hand, in the AlN substrate of Comparative Example 10, in addition to the average AlN crystal grain size being large, since there are many aggregates of the sintering additive component and pores, of which sizes exceed 10 μm, on the surface, the skewness Rsk of the mirror-finished surface shows a minus value, and furthermore, the pit size due to AlN crystal grain detachment is large. Furthermore, in Comparative Example 11, although the skewness Rsk of the mirror-finished surface and the pit size due to AlN crystal grain detachment show relatively excellent values, since the average grain size of AlN crystal grains is too small, the thermal conductivity is small.

Embodiments 20 to 24, Comparative Example 13 to 15

With each of the AlN substrates according to the aforementioned Embodiments 15 through 19 and Comparative Examples 10 through 12, a metal thin film having a structure of Ti film (thickness: 100 nm)/Pt film (thickness: 200 nm)/Au film (thickness: 500 nm) is deposited on the finished surface (for the AlN substrate of Comparative Example 12, a surface finished with the diamond abrasive is used) of the AlN substrate by means of sputtering. Thus, the individual thin film substrates are manufactured.

Of each of thus obtained thin film substrates, the peel strength of the metal thin film (multi-layered film of a substantial thickness of 800 nm) is measured. The peel strength is measured by the scotch tape peel test. Specifically, Scotch Tape (manufactured by Sumitomo 3M Co), which is larger in its area than that of the metal thin film, is attached, and the attached tape is peeled at one stroke. An area ratio of remaining thin film circuit (ratio of remaining area=(remaining area after the peel test/an area before the peel test)×100%) is measured. In addition, each of the similarly manufactured thin film circuit substrates is heated on the hot plate under the conditions of 450° C.×10 min. Swelling of the metal thin film at this time is checked. These results are shown in Table 8.

TABLE 8

| AlN Substrate | Peel Test Result (Ratio of Remaining Area, %) | Swelling after Heating Test |
|---|---|---|
| E20 | same as E15 | 50 | not observed |
| E21 | same as E16 | 65 | not observed |
| E22 | same as E17 | 85 | not observed |
| E23 | same as E18 | 80 | not observed |
| E24 | same as E19 | 70 | not observed |
| CE13 | same as CE10 | 5 | observed |
| CE14 | same as CE11 | 25 | not observed |
| CE15 | same as CE12 | 20 | observed |

E = Embodiment, CE = Comparative Example

It is obvious from Table 8 that each of the thin film substrates according to Embodiments 20 to 24 is excellent in intimate contact properties of the thin film circuit, and furthermore, there is no swelling observed when heated. Accordingly, these substrates are suitable for the substrates for microwave integrated circuits and sub-mount substrates for laser diodes. Furthermore, in each of the thin film substrates according to Embodiments 20 through 24, since the surface roughness Ra of the thin film surface of the AlN substrate is smaller than those of the AlN substrates of Embodiments 1 through 9, the circuit formation accuracy due to the metal thin film is more excellent.

Embodiments 25 to 31, Comparative Examples 16 and 17

With the exception of changing the thickness of the AlN substrate to each of those shown in Table 9, in the similar ways as Embodiment 13, Embodiment 23 and Comparative Example 14, the thin film substrates having the AlN substrate are prepared, respectively. Individual thin film substrates are heated, similarly as Embodiment 13, under the conditions of 450° C.×10 min and 600° C.×10 min, on the hot plate, and are checked of the swelling of the metal thin film at that time. These results are shown in Table 9.

TABLE 9

| Form of Thin Film Substrate | Thickness of AlN Substrate (mm) | Swelling after Heat Treatment under 450° C. × 10 min | Swelling after Heat Treatment under 600° C. × 10 min |
| --- | --- | --- | --- |
| E25 same as E13 | 1.5 | not observed | not observed |
| E26 same as E13 | 0.4 | not observed | not observed |
| E27 same as E13 | 0.3 | not observed | not observed |
| E28 same as E23 | 1.0 | not observed | not observed |
| E29 same as E23 | 0.8 | not observed | not observed |
| E30 same as E23 | 0.4 | not observed | not observed |
| E31 same as E23 | 0.1 | not observed | not observed |
| CE16 same as CE14 | 0.4 | not observed | observed |
| CE17 same as CE14 | 0.1 | observed | observed |

E = Embodiment, CE = Comparative Example

It is obvious from Table 9 that the individual thin film substrates according to Embodiments 25 through 31 show excellent characteristics even when the thickness of the AlN substrate is changed. On the other hand, as in Comparative Examples 16 and 17, in case of the AlN substrate low in thermal conductivity such as less than 160 W/m K being used, when the thickness of the substrate is made thinner, the swelling tends to occur. This is considered that since, in the substrate low in the thermal conductivity, the heat dissipation properties deteriorates, when the thickness of the substrate is made thinner, an adverse influence is caused on the metal thin film.

As obvious from the aforementioned embodiments, according to the aluminum nitride substrate of the present invention, in addition to making use of the heat dissipation characteristics thereof, the intimate contact properties with the metal thin film and the deposition accuracy of the metal thin film may be increased. As a result, according to the thin film substrates that use such aluminum nitride substrates, reliability and operational characteristics of the thin film circuit devices, such as microwave integrated circuits, and the sub-mount substrates of various kinds of electronic components may be improved. In particular, even when the thickness of the AlN substrate is made thinner, reliability of the thin film substrate may be improved.

It is to be understood that the invention is not restricted to the particular embodiments set forth herein as illustrated, but embraces all such modified forms thereof that come within the scope of the following claims.

What is claimed is:

1. An aluminum nitride substrate comprising an aluminum nitride sintered body containing a rare earth oxide as a sintering additive component;

wherein a surface of said aluminum nitride substrate is machined so that an arithmetic average roughness Ra is 0.05 μm or less and a skewness Rsk is 0 or more and 1 or less, the surface comprising aluminum nitride crystal grains and aggregates of the sintering additive component containing rare earth oxide formed between the aluminum crystal grains, the size of each of the aggregates is 20 μm or less and a total area of the aggregates present in a unit area of the surface is 5% or less, and wherein the number of the aggregates of the sintering additive component and the number of pores, of which sizes are 10 μm or more in a unit area of 100×100 μm of the surface, is less than or equal to 3 in the total.

2. An aluminum nitride substrate as set forth in claim 1:

wherein the aluminum nitride sintered body comprises aluminum nitride crystal grains of which average grain size is in the range of from 3 to 5 μm and standard deviation of a grain size distribution is 2 μm or less.

3. An aluminum nitride substrate as set forth in claim 1:

wherein a mass diminution ratio, after the aluminum nitride substrate is immersed in an acid solution diluted to 20% and kept at a temperature of 40° C., for 60 min, is, 0.1% or less.

4. An aluminum nitride substrate as set forth in claim 1:

wherein a diminution ratio of three point bending strength of the aluminum nitride substrate, after the aluminum nitride substrate is immersed in an acid solution diluted to 20% and kept at a temperature of 40° C., for 60 min, is 30% or less with respect to that before the immersion in the acid solution.

5. An aluminum nitride substrate as set forth in claim 1:

wherein the aluminum nitride sintered body contains at least yttrium oxide as the rare earth oxide.

6. An aluminum nitride substrate as set forth in claim 1:

wherein thermal conductivity at room temperature is 160 W/m K or more.

7. A thin film substrate, comprising:

an aluminum nitride substrate set forth in claim 1; and a metal thin film formed on the machined surface of the aluminum nitride substrate.

8. A thin film substrate as set forth in claim 7:

wherein the aluminum nitride substrate has a thickness of 1.5 mm or less.

9. A thin film substrate as set forth in claim 7:

wherein the metal thin film has a single metal film or a laminate film made of a plurality of metal films, a total thickness thereof being 3 μm or less.

10. A thin film substrate as set forth in claim 7:

wherein the thin film substrate is used for a substrate for a microwave integrated circuit.

11. A thin film substrate as set forth in claim 7:

wherein the thin film substrate is used for a sub-mount substrate for mounting a laser diode.

12. A manufacturing method of a thin film substrate, comprising:

preparing an aluminum nitride sintered body of which average grain size of aluminum nitride crystal grains is in the range of from 3 to 5 μm and standard deviation of a grain size distribution is 2 μm or less;

performing semi-finish on a surface of the aluminum nitride sintered body with diamond abrasive so that skewness Rsk of the surface after semi-finish is −1 or more;

preparing an aluminum nitride substrate by mirror-finishing the surface of the semi-finished aluminum nitride sintered body so that arithmetic average roughness Ra is 0.05 μm or less, and by performing finish machining so that skewness Rsk of the machined surface is 0 or more and 1 or less; and depositing a metal thin film on the machined surface of the aluminum nitride substrate.

* * * * *